United States Patent
Ramanathan et al.

(10) Patent No.: US 6,803,323 B2
(45) Date of Patent: Oct. 12, 2004

(54) METHOD OF FORMING A COMPONENT OVERLYING A SEMICONDUCTOR SUBSTRATE

(75) Inventors: Lakshmi Narayan Ramanathan, Chandler, AZ (US); Douglas G. Mitchell, Tempe, AZ (US); Varughese Mathew, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 11 days.

(21) Appl. No.: 10/159,633

(22) Filed: May 30, 2002

(65) Prior Publication Data

US 2003/0224613 A1 Dec. 4, 2003

(51) Int. Cl.$^7$ .............................................. H01L 21/302
(52) U.S. Cl. ...................... 438/745; 438/748; 438/750; 438/751; 438/754
(58) Field of Search ................................. 438/745, 748, 438/751, 754, 750

(56) References Cited

U.S. PATENT DOCUMENTS

| 5,409,567 | A | | 4/1995 | Lytle et al. |
| 6,114,097 | A | * | 9/2000 | Malba et al. ................ 430/314 |
| 6,190,237 | B1 | * | 2/2001 | Huynh et al. ................. 451/41 |
| 6,204,997 | B1 | * | 3/2001 | Sasaki ........................ 360/123 |
| 6,610,596 | B1 | * | 8/2003 | Lee et al. ................... 438/653 |

* cited by examiner

*Primary Examiner*—Nadine G. Norton
*Assistant Examiner*—Binh X. Tran
(74) *Attorney, Agent, or Firm*—Robert A. Rodriguez; Michael J. Balconi-Lamica

(57) ABSTRACT

A passive integrated component (10) is formed overlying a semiconductor substrate by etching a composite conductive layer using a solution of sodium persulfate or ceric ammonium nitrate to remove a lower portion of the composite copper layer (64) exposed by an upper portion of the composite copper layer (74, 76, 78) to expose an underlying surface (62).

17 Claims, 3 Drawing Sheets

METHOD OF FORMING A COMPONENT OVERLYING A SEMICONDUCTOR SUBSTRATE

FILED OF THE INVENTION

The present invention relates generally to semiconductor manufacturing, and more particularly to a method for manufacturing a component overlying a semiconductor substrate.

BACKGROUND OF THE INVENTION

Passive components such as capacitors and inductors are often coupled to semiconductor devices externally as discrete components. However, external coupling can be complicated in that it requires consideration of parasitic effects of the passive-active device interface. It additionally incurs costs both in terms of the individual discrete components and by decreasing the effective surface area of the semiconductor device in order to accommodate the interface. Reliability issues can also be a concern due to integration complexities associated with externally mounting the passive components to the semiconductor device. In response to these issues, passive components are more commonly being integrated into the backend of semiconductor manufacturing processes and the components formed as part of the semiconductor device, for example overlying the semiconductor device passivation layer.

Shown in FIG. 1 is a top down view of an inductor 10, and shown in FIG. 2 is a cross-sectional view of a portion of the inductor 10 that includes lead portions 12, 14, and 16 formed over a passivation layer 5 and interconnect 3 of a semiconductor device 1. A blanket adhesion/barrier layer 7 and a seed layer 9 have been physically vapor deposited (PVD) overlying the passivation layer 5 and interconnect 3, and the lead portions 12, 14, and 16 have been deposited over the seed layer 9. The lead portions have been formed using conventional patterning and plating processes.

To complete fabrication of the inductor 10, portions of the exposed seed layer 9 and adhesion/barrier layer 7 must be removed to electrically isolate the leads 12, 14, and 16. Preferably, processes used to remove the exposed portions of the seed layer 9 and adhesion/barrier layer 7 are capable of selectively removing them without removing too much bulk material from the leads 12, 14 and 16. Ideally, the processes used to remove the seed layer 9 and barrier layer 7 should not attack the leads 12, 14, and 16. One etchant reported to selectively etch PVD copper with respect to electroplated copper is disclosed in U.S. Pat. No. 5,409,567 (hereinafter the '567 patent), which is assigned to the assignee hereof, and is hereby incorporated by reference. However, the etchant disclosed in the '567 patent is affected by changes in pH and requires the addition of a buffer for stability. In addition, its effectiveness at removing the seed layer is impacted by spacing dimensions between the leads 12, 14, and 16. Other etchants, such as a solution of sodium chlorite and ammonium hydroxide, which have also been used, are too aggressive and remove too much of the bulk material from the electric leads 12, 14 and 16 while removing the seed layer 9.

For example, referring to FIG. 3, when the spacing dimension is reduced below a minimum critical dimension 24, the ability of the solution to etch the seed and barrier layer becomes impaired and residual portions 34 of the seed and barrier layer cannot be removed. Failure to remove residual portions 34 results in electrical shorts between the leads 14 and 16, which can result in failure or reliability problems. In addition, areas exposed by dimensions greater than the critical dimension, such as for example, dimension 22, may have non-planar or stepped surfaces. In these areas, residual conductive material 32 may become trapped and create paths for electrical shorts to occur in other regions of the passivation layer.

One possible solution to these problems includes increasing the overetch time or using more aggressive etchants. However, as shown in FIG. 4, this can have the effect of etching too much of the bulk conductive material that forms the conductive leads 12, 14, and 16. This can result in excessive thinning of the leads, which can alter the component's characteristics or impact its functionality. In extreme cases, too much overetch can result in peeling of the leads 12, 14, or 16. This, coupled with the inherent non-uniformity of wet processing, can result in component peeling in some areas of the semiconductor substrate before removing the seed layer from other parts of the wafer. The effect and impact of non-uniformity becomes more pronounced when simultaneously etching multiple wafers.

BRIEF DESCRIPTION OF THE DRAWINGS

The features and advantages of the present invention will be more clearly understood from the following detailed description taken in conjunction with the accompanying FIGURES where like numerals refer to like and corresponding parts and in which.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION OF THE DRAWINGS

The present invention contemplates a method for forming a component overlying a semiconductor substrate. More particularly, the present invention contemplates a method for selectively removing portions of a seed layer and barrier layer from between electroplated features of a component being formed over the semiconductor substrate. Although embodiments disclose formation of an integrated passive inductor structure, one of ordinary skill recognizes that these embodiments are readily extendable to the formation of other components such as capacitors, power busses, voltage coupled oscillators, transformers and the like.

Figure 5:
FIGS. 5–8 illustrate cross-sectional views of a semiconductor substrate during fabrication of the inductor of FIG. 1 using embodiments of the present invention.

Embodiments of the present invention will now be more fully discussed in reference to the accompanying figures. FIG. 5 illustrates a cross-sectional view of a partially fabricated semiconductor device that includes an uppermost interconnect level (interconnect 52) formed overlying a semiconductor device substrate 50. As used in this specification the uppermost interconnect level refers to an interconnect level formed prior to formation of the uppermost passivation level and after formation of underlying interlevel dielectric (ILD) layers, vias, and interconnects. Illustrative details with respect to semiconductor substrate 50 have been omitted for simplicity of the drawings. However, one of ordinary skill recognizes that up to this point in the processing the semiconductor substrate 50 can include one or more levels of ILDs, vias, and interconnects, as well as active and passive devices, such as transistors, memory cells, capacitors, resistors, and the like.

In addition, passivation layer 54 has been formed over the semiconductor device substrate. In one specific non-limiting embodiment, the passivation layer 54 comprises a layer of chemically vapor deposited (CVD) silicon nitride overlying a layer of CVD phosphosilicate glass (PSG) overlying a thermally enhanced CVD silicon dioxide hard mask layer. In alternative embodiments the passivation layer can optionally or alternatively include a variety of other materials, such as silicon oxynitride, silicon dioxide deposited using tetraethoysilane as a source gas, borophosphosilicate glass, and the like. The combined nitride and PSG layer thickness is in a range of approximately 300–900 nanometers and the thickness of the hardmask layer is in a range of 100–300 nanometers. The passivation layer 54 is patterned using conventional lithography and etched using conventional plasma or wet dielectric etch processes to define passivation openings 56 that expose portions of interconnect 52.

Figure 6:
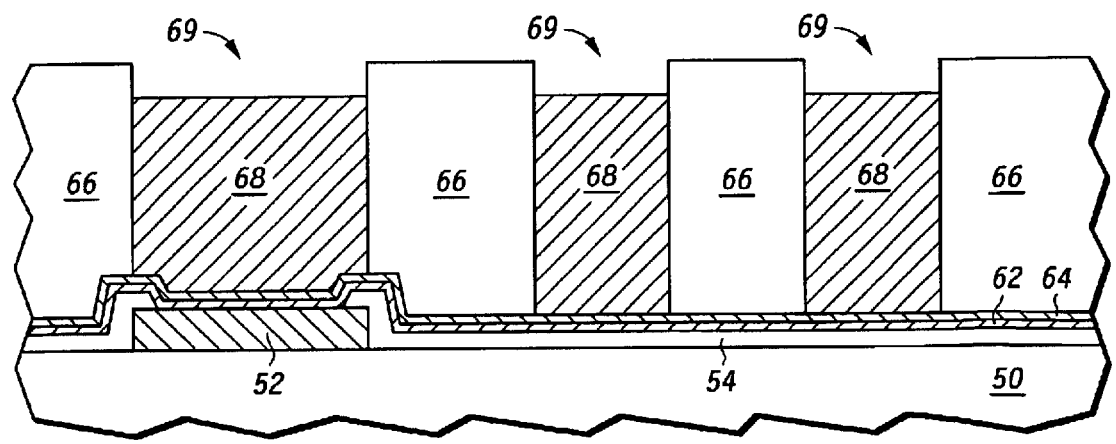

Turning to FIG. 6, an adhesion/barrier layer 62 and seed layer 64 have been blanket deposited over the exposed substrate surface, a patterned resist layer 66 has been formed over the seed layer 64, and a bulk conductive material 68 has been plated within patterned openings 69 of the resist layer 66. In one embodiment, prior to depositing the adhesion/barrier layer 62, the substrate is first sputter-cleaned using a conventional sputter cleaning process. The adhesion barrier layer 62 is then deposited using a conventional sputtering deposition method. In one embodiment, the adhesion/barrier layer 62 is a layer of titanium tungsten (TiW) having a thickness in a range of approximately 100–200 nanometers. In alternative embodiments, the adhesion barrier layer 62 can include titanium, titanium tungsten nitride, titanium nitride, nickel vanadium, chromium, or combinations thereof. Next, the seed layer 64 is blanket deposited over the adhesion/barrier layer 62. In one embodiment, the seed layer 64 is a layer of sputter deposited copper having a thickness in a range of approximately 100–200 nanometers. In alternative embodiments, other conductive metals, such as gold can be used to form the seed layer. Typically, the sputter preclean, the adhesion/barrier layer 62 deposition, and the seed layer 64 deposition are all sequentially deposited-inside the same processing tool, although this is not necessarily a requirement of the present invention.

After depositing the seed layer, a resist layer 66 is formed over the seed layer and patterned to form openings 69 that expose portions of the seed layer 64. Next a conductive material 68 is plated onto exposed portions of the seed layer 64 and within the openings 69 as shown in FIG. 6. The resist and patterning process to form the openings are conventional, however for increasingly thick resist layers, multiple resist coat and bake steps may be necessary. In one embodiment, the conductive material 68 is a copper film deposited using a conventional electroplating process. Alternatively, electroless plating or PVD may be used to deposit the conductive material 68. In addition, the conductive material 68 may alternatively be formed using gold, or nickel or may comprise alloying elements, such as magnesium, indium, tin, chromium, zinc, carbon, zirconium, palladium, titanium, iron, niobium, nickel iron, magnesium, or the like. In one specific embodiment, the conductive material 68 is an electroplated copper film having a thickness in a range of approximately 4–15 $\mu$m.

Figure 1:
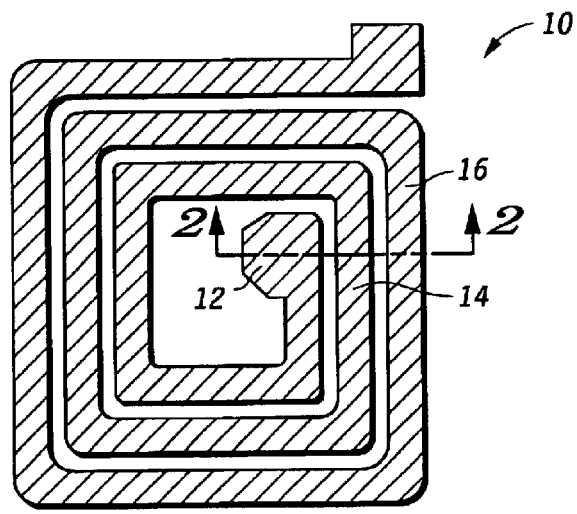
FIG. 1 is a top-down view illustrating an example of an inductor that can be formed overlying a semiconductor substrate.
Figure 2:
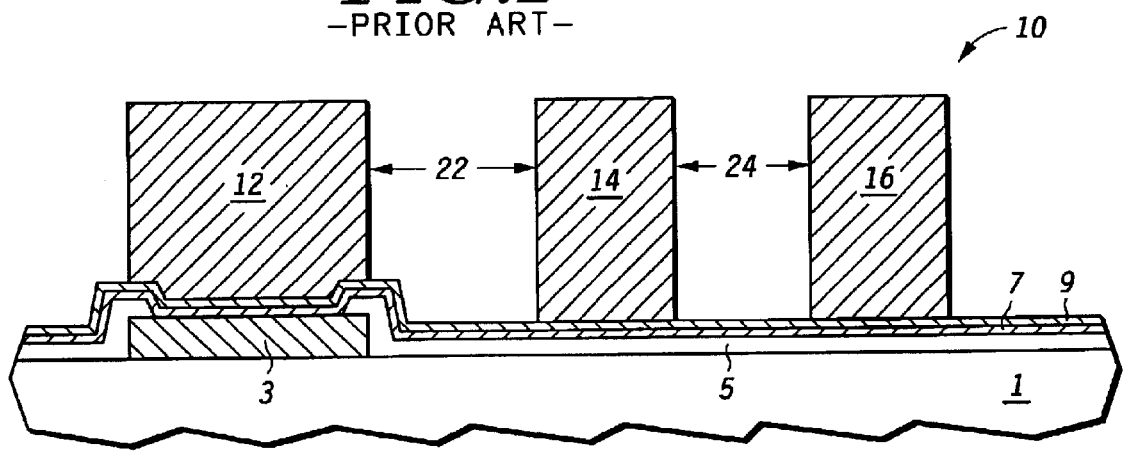
FIGS. 2–4 illustrate cross-sectional views showing prior art issues associated with forming the inductor shown in FIG. 1 overlying a semiconductor substrate.
Figure 3:
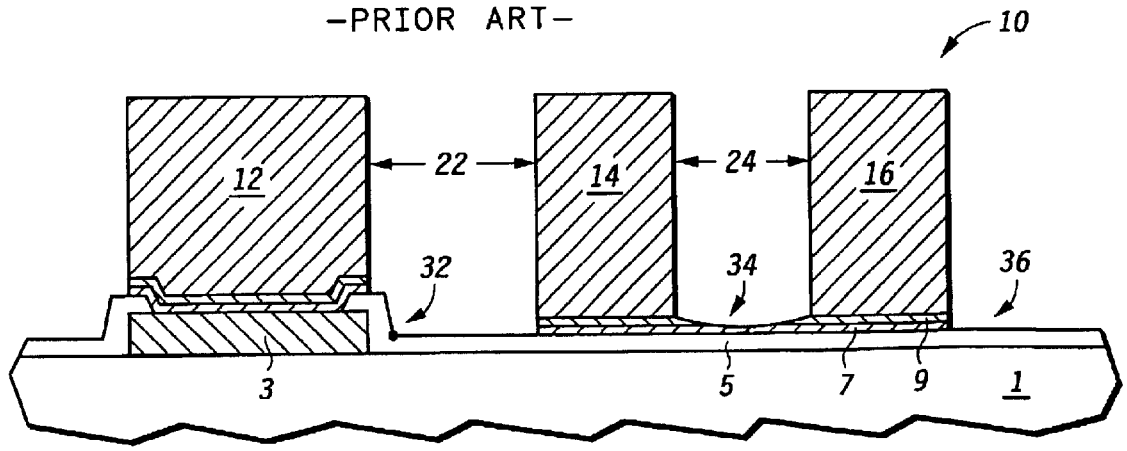
Figure 4:
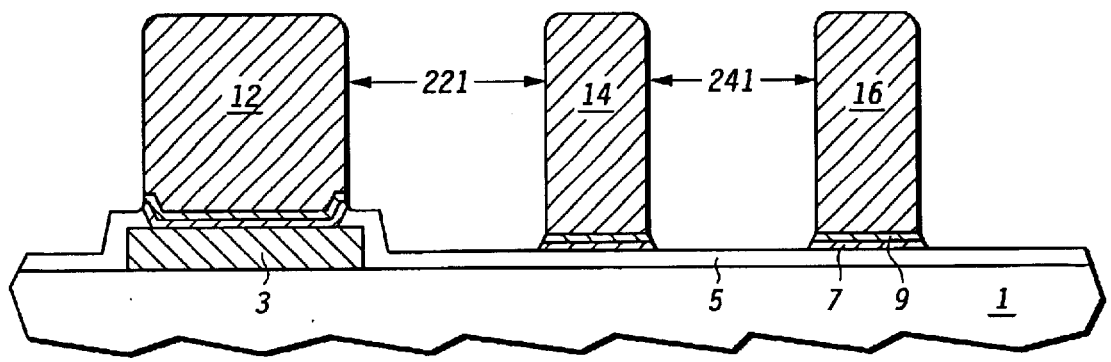
Figure 7:
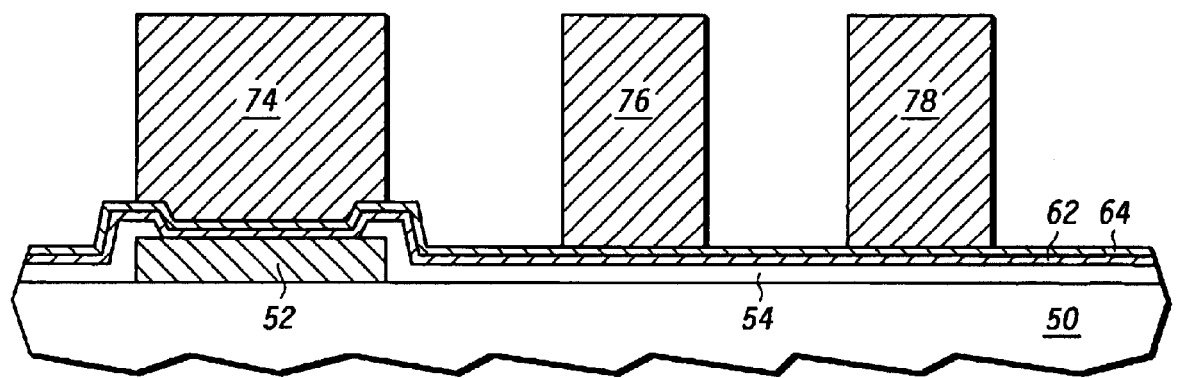

Shown in FIG. 7 is a cross-sectional view illustrating the semiconductor device substrate shown in FIG. 6, after removing the patterned resist layer 66 and prior to etching the seed layer and barrier layer. The patterned resist layer 66 can be removed using conventional resist stripping processes. For example, using an oxygen-containing plasma ash process or a wet chemical process. The removal of the resist layer 66 exposes portions of the seed layer 64 that are not covered by the conductive members 74, 76, and 78. The conductive members 74, 76, and 78 are integrated passive structures similar to the coil lead portions 12, 14, and 16 of the inductor 10 shown in FIG. 1.

In accordance with embodiments of the present invention, the next step in the process to define the component includes selectively removing the exposed seed layer portions and then selectively removing the underlying adhesion/barrier layer, with minimum removal of the integrated passive structures 74, 76, and 78. Under ideal circumstances, the integrated passive structures 74, 76, and 78 should not be attacked. As stated previously, spacing dimensions between the inductor leads as well as the width of the inductor coils or leads 74, 76, and 78, are continuing to be reduced. This is being driven both by performance requirements and the need to accommodate the scaling of semiconductor devices. The present inventors determined that conventional prior art processes were either ineffective or too aggressive for removing portions of the seed layer when the spacing between individual inductor leads and the width of the leads decreased below a minimum dimension.

The aspect ratio of the opening between the leads, which is determined by dividing the height of the leads by the spacing between adjacent leads, impacts how readily the etch chemistry can selectively remove the exposed seed layer portions. For example, when the spacing dimension between individual inductor leads having a height of approximately 10 microns fell below approximately seven microns, the prior art processes were found to be marginal and when the spacing fell below six microns the prior art processes were found to be inadequate for removing the exposed seed layer either because the process was not capable of completely removing the seed layer or it removed too much of the electroplated copper. Furthermore, process nonuniformity often resulted in peeling of structures located at the edge of the wafer prior to completely removing the seed layer between structures at the center of the wafer. This problem became more pronounced as the diameter of the wafer and the aspect ratio of the features increased.

The present inventors have discovered two processes that are capable of selectively removing the exposed copper seed layer portions from between inductor coils. In the first process the seed layer is etched using a solution of sodium persulfate ($Na_2S_2O_8$) and in the second process the seed layer etched using a solution of ceric ammonium nitrate (($NH_4)_2Ce(NO_3)_6$).

In the first process, the substrate is placed into a spray acid tool (SAT), such as a Semitool SAT40812(4P) CDU. Then the wafer is rotated at a speed of less than 15 revolutions per minute (RPM), and more preferably less than 12 RPM while flowing a solution of 0.5–10% by weight of sodium persulfate ($Na_2S_2O_8$) over the semiconductor substrate. The temperature of the solution is in a range of approximately 20–40 degrees Celsius.

In one specific embodiment, to remove approximately 200 nanometers of copper seed layer from between electroplated copper features that are 10 microns thick and spaced approximately 6 microns apart, the substrate was rotated in the spray acid tool at approximately 8 RPM while spraying a 1.9% by weight sodium persulfate solution through a fan spray dispense nozzle for a time of approximately 180 seconds at a flow rate of approximately 6 liters per minute. The temperature of the solution prior to dispense was controlled within a range of 25–29 degrees Celsius.

Under these processing conditions, the process selectively removed a 200-nanometer thick seed layer from between the electroplated Cu structures in 3 minutes, while removing approximately 1 to 1.5 microns of the electroplated copper. The uniformity of the etch process was such that the 2000A of sputtered seed Cu was removed from between plated Cu integrated passive features on as many as 25 wafers, without compromising the mechanical integrity of the plated Cu features (i.e., causing peeling). On a blanket plated copper film and a blanket sputtered copper film, these processing conditions translated to removal rates of approximately 250 nanometers per minute and 200 nanometers per minute, respectively.

The sodium persulfate solution was prepared in advance by first dissolving 500 grams of commercial sodium peroxydisulfate in 3.5 liters of deionized water. This stock solution was stored in a chemical delivery unit (CDU). Then, 12-liter batches of the final sodium persulfate solutions were prepared for use by the spray acid tool by dissolving 1600 milliliters of the chemical delivery unit solution with 10.4 liters of deionized water. Additionally, salts similar to sodium peroxydisulfate, such as ammonium peroxydisulfate, are capable of producing similar results when prepared and used within the range of process conditions specified for sodium peroxydisulfate.

In the second process, the substrate was placed in a bath solution of 2.3% by weight of ceric ammonium nitrate in dionized water at a temperature of 40° C. Temperatures between 30° and 50° C. produced acceptable result as long as the processing times were adjusted to account for the increase in activity that accompanies higher temperatures. On blanket plated copper films and blanket sputtered copper films, these processing conditions translated to removal rates of approximately 180 nanometers per minute and 170 nanometers per minute, respectively.

After removing the seed layer the adhesion/barrier layer is removed using a solution of 30% hydrogen peroxide. This can be accomplished using a bath process or alternatively, using the same spray acid tool used to remove the seed layer. The spray acid tool is advantageous because it allows for integration of both the seed layer etch process and the adhesion/barrier layer etch process all on a single processing platform. In one specific embodiment, the adhesion barrier layer was removed in spray acid tool by spraying the hydrogen peroxide solution over the substrate for approximately 12 minutes while rotating the substrate at 20 rpm and dispensing the solution at a rate of 1.9±0.25 liters per minute. Revolution rates between 8 and 30 produced acceptable etch results. The temperature of the hydrogen peroxide is in a range of approximately 40–50 degrees Celsius. Finally after the adhesion/barrier layer 7 is removed the wafer is rinsed using deionized water and then dried.

Figure 8:
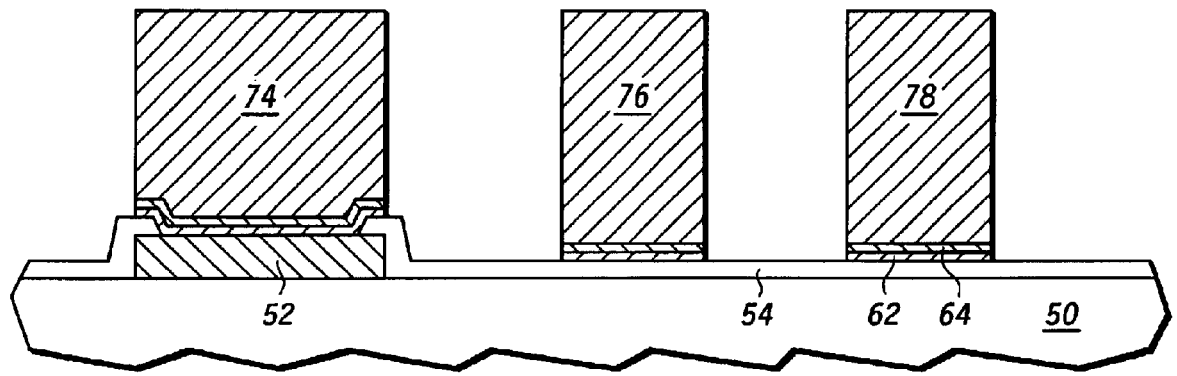

Turning to FIG. 8, at this point in the process, exposed portions of the seed layer 9 and adhesion/barrier layer 7 have been effectively removed from between the leads 74, 76, and 78. If necessary, a dilute sulfuric acid dip can additionally be incorporated to remove residual surface copper oxide. The substrate can now be processed through subsequent processes and operations as necessary to complete fabrication of the semiconductor device, such as for example, the formation of conductive bumps, test, sort, die separation, and die mount.

The Process integration scheme(s) herein described are advantageous over prior art methods because they effectively remove exposed seed and adhesion/barrier layer portions from between tightly pitched conductive features such as inductors, capacitor, or power buss structures. In addition, because the etch processes do not remove too much of the bulk electroplated copper material, the substrates can be etched for extended periods of time. This has the benefit of promoting removal of residual material that may be trapped in crevasses that are the result of passivation layer topography. Use of the spray acid tool also advantageously improves throughput by allowing for the simultaneous processing of multiple substrates. Moreover, the processes to remove the seed and barrier layers can be integrated into a single spray acid tool, which improves cycle time and increases factory workspace. In addition, these processes are advantageous in that they can all be incorporated into existing processing flows without requiring the use of additional or elaborate processing steps. The ceric ammonium nitrate solution is also capable of being incorporated into a variety of other types of processing schemes beyond that of a spray acid tool applications, such as for example wet hoods, dip tools, flow cells, and the like.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. Benefits, other advantages, and solutions to problems have been described with regard to specific embodiments. However, the benefits, advantages, solutions to problems, and any element(s) that may cause any benefit, advantage, or solution to occur or become more pronounced are not to be construed as a critical, required, or essential feature or element of any or all the claims.

What is claimed is:

1. A method for etching a semiconductor substrate comprising:

exposing composite copper layer formed overlying the semiconductor substrate to a solution of sodium persulfate, wherein the composite copper layer includes an upper portion and a lower portion in first regions and wherein the composite copper layer includes the lower portion only in second regions, the second regions being disposed within openings outside the first regions, the openings having been formed by removal of a patterned resist; and removing the lower portion of the composite copper layer in the second regions in response to exposure of the lower portion of the composite copper layer to the solution of sodium persulfate to expose an underlying surface in the second regions.

2. The method of claim 1, further comprising physically displacing the semiconductor substrate during exposing.

3. The method of claim 2, wherein physically displacing the semiconductor substrate is further characterized as rotating the semiconductor substrate and wherein a rotation is less than approximately 15 revolutions per minute.

4. The method of claim 3, wherein the rotation is less than approximately 10 revolutions per minute.

5. The method of claim 2, wherein a temperature of the solution is less than approximately 40 degrees Celsius.

6. The method of claim 5, wherein a temperature is the solution is less than 30 degrees Celsius.

7. The method of claim 1, wherein the composite copper layer is further characterized as an electroplated copper film overlying a physically vapor deposited lower copper film.

8. The method of claim 7, wherein a thickness of the electroplated copper film is greater than approximately four microns.

9. The method of claim 8, wherein a spacing between features defined by the electroplated copper film is less than approximately seven microns.

10. The method of claim 7, wherein the composite copper layer forms a passive integrated component of a semiconductor device.

11. A method for etching a semiconductor substrate comprising:

exposing a composite copper layer formed overlying the semiconductor substrate to a solution of 0.5 to 50% by weight of ceric ammonium nitrate, wherein the composite copper layer includes an upper portion and a lower portion in first regions and wherein the composite copper layer includes the lower portion only in second regions, the second regions being disposed within openings outside the first regions, the openings having been formed by removal of a patterned resist; and removing the lower portion of the composite copper layer in the second regions in response to exposure of the lower portion of the composite copper layer to the solution of 0.5 to 50% by weight of ceric ammonium nitrate to expose an underlying surface in the second regions.

12. The method of claim 11, further comprising physically displacing the semiconductor substrate during exposing the composite copper layer.

13. The method of claim 11, wherein a temperature of the solution is less than approximately 60 degrees Celsius.

14. The method of claim 11, wherein the composite copper layer is further characterized as a patterned electroplated copper film overlying a physically vapor deposited copper film.

15. The method of claim 14, wherein a thickness of the patterned electroplated copper film is greater than approximately 4 microns.

16. The method of claim 15, wherein a spacing between features defined by the electroplated copper film is less than approximately seven microns.

17. The method of claim 16, wherein the composite copper layer forms a passive integrated component of a semiconductor device.

* * * * *

UNITED STATES PATENT AND TRADEMARK OFFICE
CERTIFICATE OF CORRECTION

PATENT NO. : 6,803,323 B2  
APPLICATION NO. : 10/159633  
DATED : May 30, 2002  
INVENTOR(S) : Lakshmi Narayan Ramanathan It is certified that error appears in the above-identified patent and that said Letters Patent is hereby corrected as shown below:

In Column 6, Line 45, Claim 1:

Change "exposing composite copper layer" to --exposing a composite copper layer--

Signed and Sealed this

Twentieth Day of May, 2008

JON W. DUDAS  
*Director of the United States Patent and Trademark Office*

UNITED STATES PATENT AND TRADEMARK OFFICE
CERTIFICATE OF CORRECTION

| | | |
|---|---|---|
| PATENT NO. | : 6,803,323 B2 | Page 1 of 1 |
| APPLICATION NO. | : 10/159633 | |
| DATED | : October 12, 2004 | |
| INVENTOR(S) | : Lakshmi Narayan Ramanathan | |

It is certified that error appears in the above-identified patent and that said Letters Patent is hereby corrected as shown below:

In Column 6, Line 45, Claim 1:

Change "exposing composite copper layer" to --exposing a composite copper layer--

This certificate supersedes the Certificate of Correction issued May 20, 2008.

Signed and Sealed this

Seventeenth Day of June, 2008

JON W. DUDAS
*Director of the United States Patent and Trademark Office*